United States Patent
Hansen et al.

(10) Patent No.: US 7,100,067 B2
(45) Date of Patent: Aug. 29, 2006

(54) DATA TRANSMISSION ERROR REDUCTION VIA AUTOMATIC DATA SAMPLING TIMING ADJUSTMENT

(76) Inventors: Victor Hansen, 11105 NW. Skyline Blvd., Portland, OR (US) 97231; Erik Landerholm, 13050 SW. Cottontail Ln., Beaverton, OR (US) 97008; Samuel J. Peters, II, 6342 SW. 179th Ave., Beaverton, OR (US) 97007

(*) Notice: Subject to any disclaimer, the term of this patent is extended or adjusted under 35 U.S.C. 154(b) by 555 days.

(21) Appl. No.: 10/393,088

(22) Filed: Mar. 19, 2003

(65) Prior Publication Data
US 2004/0186674 A1  Sep. 23, 2004

(51) Int. Cl.
*G06F 1/04* (2006.01)
(52) U.S. Cl. .............. 713/500; 713/400; 713/503; 713/600; 714/699; 714/700; 714/707; 714/815; 375/354; 375/359; 375/371; 375/373; 327/136; 327/149; 327/263; 327/393; 341/111; 341/121
(58) Field of Classification Search ........... 713/400, 713/401, 500, 501, 502, 503, 600; 714/699, 714/700, 707, 815; 327/136, 149, 263, 276, 327/393, 400; 341/111, 121; 386/17, 18, 386/85, 89; 375/354, 355, 357, 359, 371, 375/373
See application file for complete search history.

(56) References Cited

U.S. PATENT DOCUMENTS

| | | | | |
|---|---|---|---|---|
| 4,820,944 A | * | 4/1989 | Herlein et al. | 327/270 |
| 5,481,563 A | * | 1/1996 | Hamre | 375/226 |
| 5,745,530 A | * | 4/1998 | Baek et al. | 375/342 |
| 5,831,461 A | * | 11/1998 | Dawe | 327/147 |
| 5,903,605 A | * | 5/1999 | Crittenden | 375/226 |
| 6,150,863 A | * | 11/2000 | Conn et al. | 327/270 |

* cited by examiner

*Primary Examiner*—Lynne H. Browne
*Assistant Examiner*—Nitin C. Patel
(74) *Attorney, Agent, or Firm*—Berkeley Law & Technology Group, LLC (57) ABSTRACT

A data transmission error reduction circuit is formed including a delay circuit, a detection circuit and a control circuit. In one embodiment, the delay circuit includes n delay element and multiplexor pairs, selectively employable to apply an aggregate amount of time delay to a data signal. The detection circuit includes circuit elements to detect a critical reference time distance between a reference point of a data signal and at least a selected edge of a clock signal being smaller than a desired threshold. The control circuit includes circuit elements to dynamically control the aggregate amount of time delay applied by the delay circuit based at least in part on the detection of the detection circuit. In one application, m units of the data transmission error reduction circuit are correspondingly employed to reduce data transmission errors on m high speed parallel data signals of a data interface.

25 Claims, 6 Drawing Sheets

DATA TRANSMISSION ERROR REDUCTION VIA AUTOMATIC DATA SAMPLING TIMING ADJUSTMENT

BACKGROUND OF THE INVENTION

1. Field of the Invention

The present invention relates to the field of data communication. More specifically, the present invention relates to automatic data sampling timing adjustment, and its application to reducing data transmission errors.

2. Background Information

Advances in integrated circuit and microprocessor technologies have led to wide spread deployment and adoption of computing devices. Examples of computing devices include servers, personal computers and "special" purpose computing devices. Personal computers may have form factors, such as desktop, laptop, tablet, and so forth. "Special" purpose computing devices may include personal digital assistants (PDA), wireless mobile phones and so forth.

Concurrently, advances in networking, telecommunication, satellite and other related technologies have also led to increase connectivity between the various computing devices. Numerous applications and computing needs involve accessing, retrieving and exchanging data between computing devices interconnected over local and/or wide area networks. The networking connections may be wire based or wireless, or both (on different portions of the connections). The networks may be private and/or public.

To accommodate the larger and larger volume of data that need to be exchanged, data transmission rates/speeds, whether it is within a single integrated circuit, a circuit board, between two local devices or over a long distance networking/telecommunication connection, have steadily increased over the years.

Due to noise, signal jitters, as well as other factors, not all data transmitted will be received properly. That is, the data signals may not be presented or may be corrupted at the time periods when they are supposed to be read (also referred to as sampled). The result is data transmission error. The likelihood of an error condition occurring increases, as data are transmitted in parallel, or as operating speed increases (with the margin of tolerance decreasing correspondingly), or both.

For example, when data are transmitted between a link layer device and a physical layer device in accordance with the Optical Internetworking Forum's System Packet Interface Level 4 Phase 2 (OIF-SPI4-02.0), 16 bits are transmitted on the "data path" in parallel at a frequency as high as 644.53 MHz (for 10G Ethernet applications). As a result, the likelihood of an error condition occurring is substantially higher.

Most data transmission protocols, whether the transmissions are made over a private connection, a shared bus, a local/wide area networking connection, typically do include some error detection and handling/correction procedures. For examples, parity bits and/or cyclic redundancy checks (CRC) may be employed for error detection and/or correction. However, these prior art error detection and correction techniques, while necessary and provide for smooth or even transparent recovery, have a tendency of reducing and/or impacting the overall operational efficiency.

Thus, it is desirable if occurrence of data transmission errors can be reduced, especially in high speed or high performance data communication.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

The present invention includes an automatic data sampling timing adjustment circuit, and its application, in particular, to an enhanced receiver, which may be a component of an apparatus. The apparatus may be an integrated circuit, a circuit board, or a device.

In the following description, various configurations of storage elements and combinatorial logics will be described, to provide a thorough understanding of the present invention. However, the present invention may be practiced without some of the specific details or with alternate storage elements and/or combinatorial logics. In other instances, well-known features are omitted or simplified in order not to obscure the present invention.

The description to follow repeatedly uses the phrase "in one embodiment", which ordinarily does not refer to the same embodiment, although it may. The terms "comprising", "having", "including" and the like, as used in the present application, including in the claims, are synonymous.

System View

Figure 1:
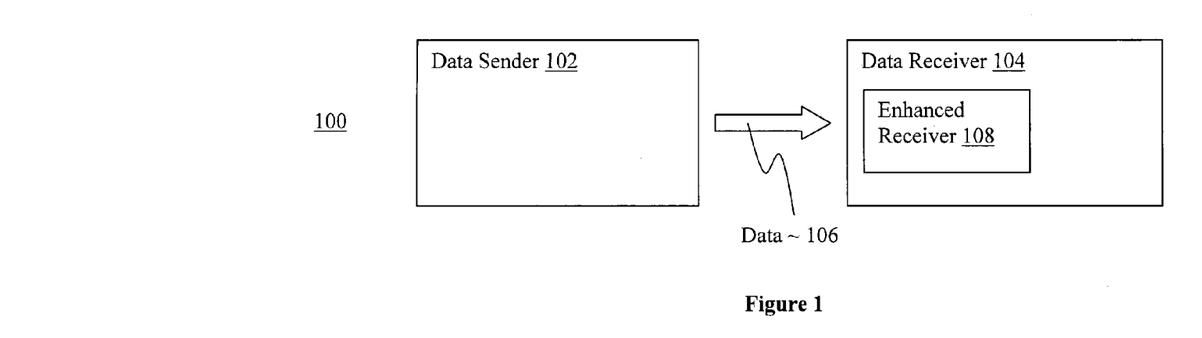
FIG. 1 illustrates a "system" view of the present invention, in accordance with one embodiment.

Referring now to FIG. 1, wherein a block diagram illustrating a system view of the present invention, in accordance with one embodiment, is shown. As illustrated, for the embodiment, system 100 comprises data sender 102 sending data 106 to data receiver 104, where data receiver 104 is advantageously equipped with enhanced receiver 108, incorporated with the teachings of the present invention, i.e. automatic data sampling timing adjustment, to reduce data transmission errors. As a result, a designer of system 100 may be at least partially relieved and be provided with a larger timing tolerance window to work with.

The terms "system", "data sender" and "data receiver" as used herein include but are not limited to data sender/receiver function blocks within an integrated circuit ("system"), data sender/receiver components within a circuit board ("system") or across multiple circuit boards ("system"), data sender/receiver devices within a collection of local devices ("system"), data sender/receiver devices within a collection of geographically distributed devices ("system"), and so forth. In other words, these terms are to be broadly construed.

In various embodiments, data sender 102 and data receiver 104 are link layer and physical layer devices respectively. In other embodiments, data sender 102 and data receiver 104 are physical layer and link layer devices respectively.

In a number of these embodiments, data 106 are transmitted in accordance with OIF-SPI4-02.0. That is, data 106 comprises 16 data bits transmitted on a "data path" in parallel. In alternate embodiments, the present invention may be practiced with larger or smaller "data path" width.

Further, the term "data" as used herein include "control" as well as "application" or "user" data.

Automatic Data Sampling Timing Adjustment

Figure 2:
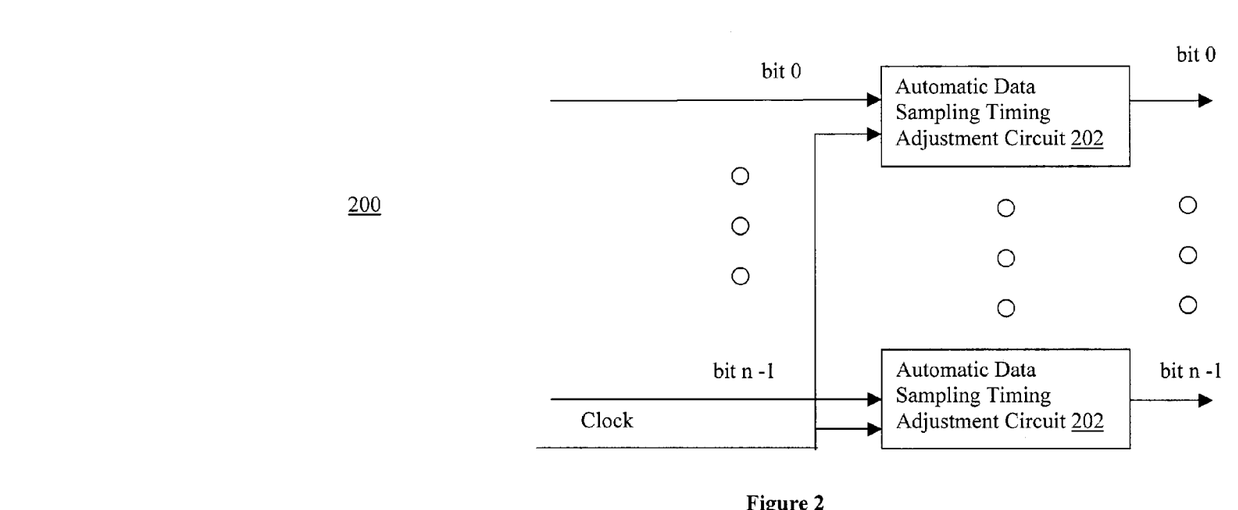
FIG. 2 illustrates the relevant aspects of the enhanced receiver of FIG. 1 in further detail, in accordance with one embodiment.

FIG. 2 illustrates the automatic data sampling timing adjustment aspect of enhanced receiver 108 in further detail, in accordance with one embodiment. As illustrated, in accordance with the teachings of the present invention, n automatic data sampling timing adjustment circuits 202 are provided, one for each data bit of a n-bit data path, to correspondingly detect for conditions that suggest data transmission error may start occurring, and automatically adjust data sampling timing for the applicable data bits, to reduce data transmission errors.

In other words, in accordance with the present invention, circuits are employed to detect for potential imminent occurrence or occurrence of data transmission errors, and corrective actions are taken to attempt to prevent the data transmission errors from occurring.

In alternate embodiments, the present invention may be practiced with only a portion of the data path being subjected to automatic data sampling timing adjustment.

Figure 3:
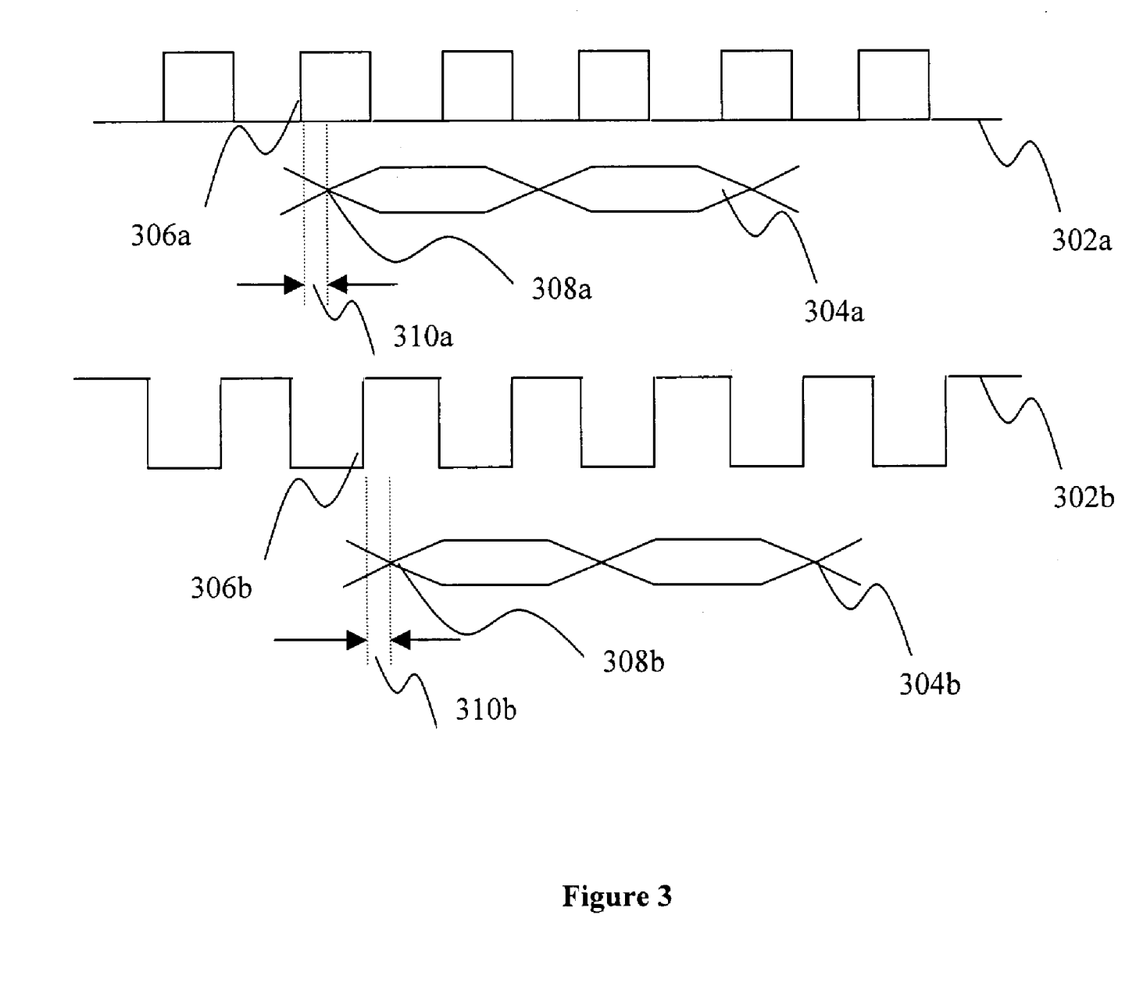
FIG. 3 illustrates two example timing situations where data transmission errors may begin to occur.

FIG. 3 illustrates two example situations when data transmission error may begin to occur. As typical with all data transmissions, data 304a or 304b are typically considered "valid", and to be read/sampled at certain time periods, relative to a clock, such as clock 302a or its inverse, such as clock inverse 302b. However, as described in the background, due to noise, signal jitters, and so forth, the "valid" data may not be properly presented at the time data is to be read/sampled.

Thus, in accordance with the present invention, a critical reference time distance, such as distance 310a or 310b, between a reference point, such as reference point 308a or 308b, and an edge, such as edge 306a or 306b of a reference clock, such as clock 302a or an inverse of the clock, such as, clock inverse 302b, is selected.

As will be described in more detail below, automatic data sampling timing adjustment circuit 202 monitors for data transition conditions that are faulty or at risk to become faulty. More specifically, for various embodiments, automatic data sampling timing adjustment circuit 202 monitors for the critical reference time distance 310a/310b, and when the critical reference time distance 310a/310b becomes smaller than a design threshold (also referred to as desired threshold), automatic data sampling timing adjustment circuit 202 dynamically modifies an amount of time delay effectively applied to the data signal relative to the clock signal.

By "effective", the present application refers to the fact that the desired relatively delay may be applied to the data signal, the clock signal or both (differentially).

The clock edge is typically the edge against which the valid reading/sampling period is defined. In other words, the present invention monitors for the condition when a data signal has effectively drifted by a sufficient amount, relative to the reference edge of the clock, i.e. becoming too close to the reference edge, and at risk to be deemed in error if further drifting is to occur, or already being deemed to be in error. On detection, a dynamic modification to the amount of time delay effectively applied to the data signal is made.

The dynamic modification may include effectively applying an amount of time delay, when effectively, no time delay was previously applied, or effectively increasing/decreasing the previously applied amount of time delay.

Effectively applying an amount of time delay when effectively no time delay was previously applied, or effectively increasing the previously applied amount of time delay, has the effect of deferring the data sampling. Effectively decreasing the previously applied amount of time delay has the effect of performing the data sampling earlier. Depending on which edge of the clock signal, the data signal is being "too close", one of the actions, i.e. deferring the data sampling or performing earlier, will prevent or remedy the error (while the other action will cause the data sampling to be performed a cycle too early or a cycle too late).

As will be described in more detail below, in various embodiments, at least some of the data sampling timing adjustment circuits 202 are equipped with control circuits that modify the effective increase/decrease of the amount of delay applied in a manner that facilitates quickly leading to the appropriate preventive or remedial action.

Figure 4:
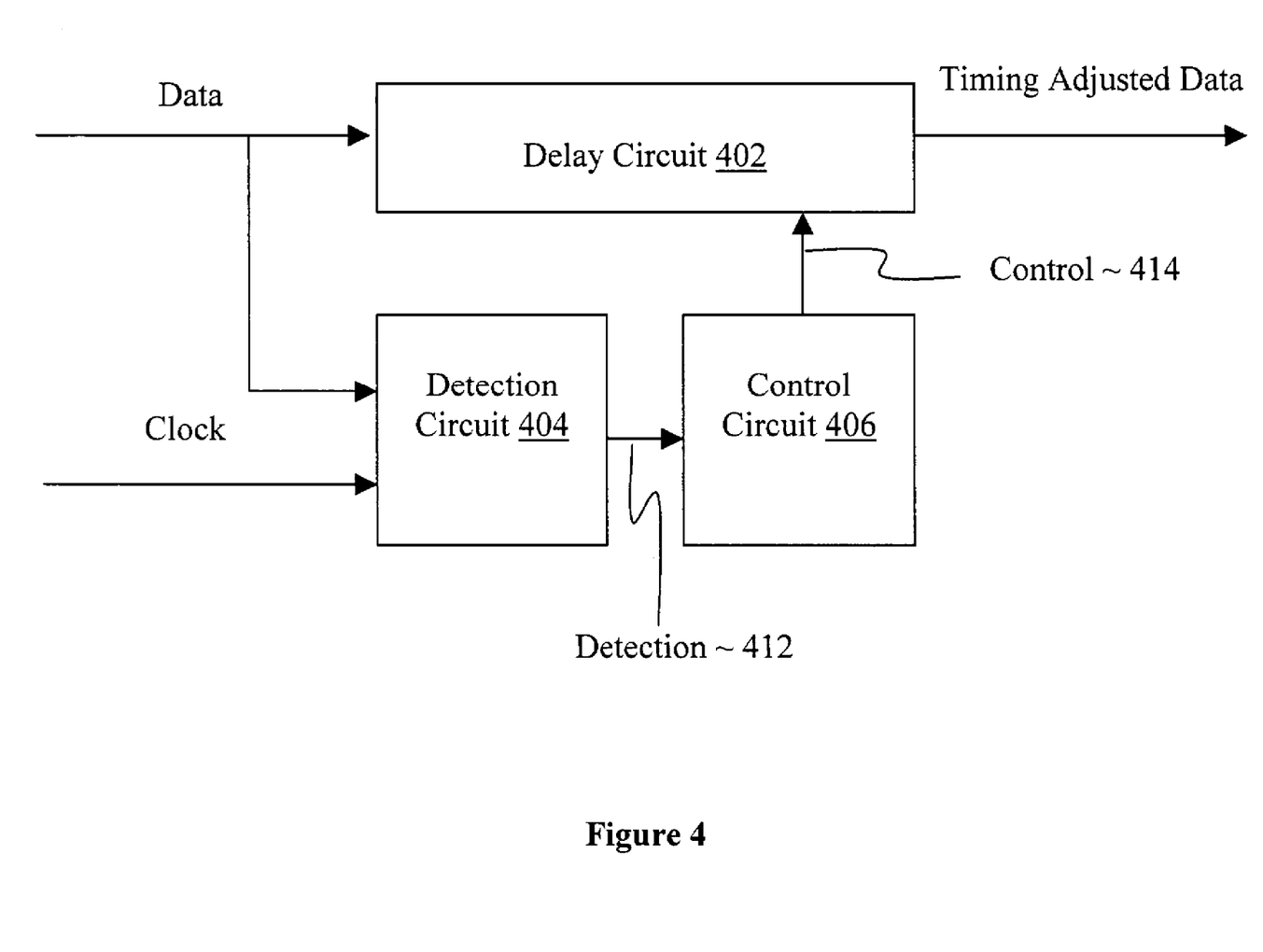
FIG. 4 illustrates the automatic data sampling timing adjustment circuit of FIG. 2 for automatically re-aligning a data signal relative to a clock, in accordance with one embodiment.

FIG. 4 illustrates automatic data sampling timing adjustment circuit 202 in further detail, in accordance with one embodiment. As illustrated, for the embodiment, automatic data sampling timing adjustment circuit 202 comprises delay circuit 402, detection circuit 404, and control circuit 406 coupled to each other, and the data signal, as shown.

Delay circuit 402, for the embodiment, is employed to apply an aggregate amount of time delay to the data signal, to adjust its timing, to effectuate the desired timing change relative to the clock signal. Detection circuit 404 is employed to detect for the earlier described error or "at risk" data transition condition, i.e. the critical reference time distance between a reference point of the data signal and a selected edge of the clock has become smaller than a design/desired threshold. On detection, detection circuit 404 outputs a signal denoting detection of the "at risk" condition. Control circuit 406 is employed to dynamically control the aggregate amount of time delay being applied by delay circuit 402 to the data signal, based at least in part on the detection signals outputted by detection circuit 404.

In alternate embodiments, the delay may be applied to the clock signal to achieve the desired effective delay of the data signal relative to the clock signal. Further, the delay to the clock signal, as opposed to being applied an individual derived version corresponding to the data signal, the present invention may be practiced with the delays being applied to a derived version of the clock signal that is corresponding to a group of the data signals or to all the data signals.

For the embodiment, detection circuit 404 is advantageously dependent on the presence of data on the data signal lines. No faulty or risky condition could be identified without presence of data.

Delay Circuit

Figure 5:
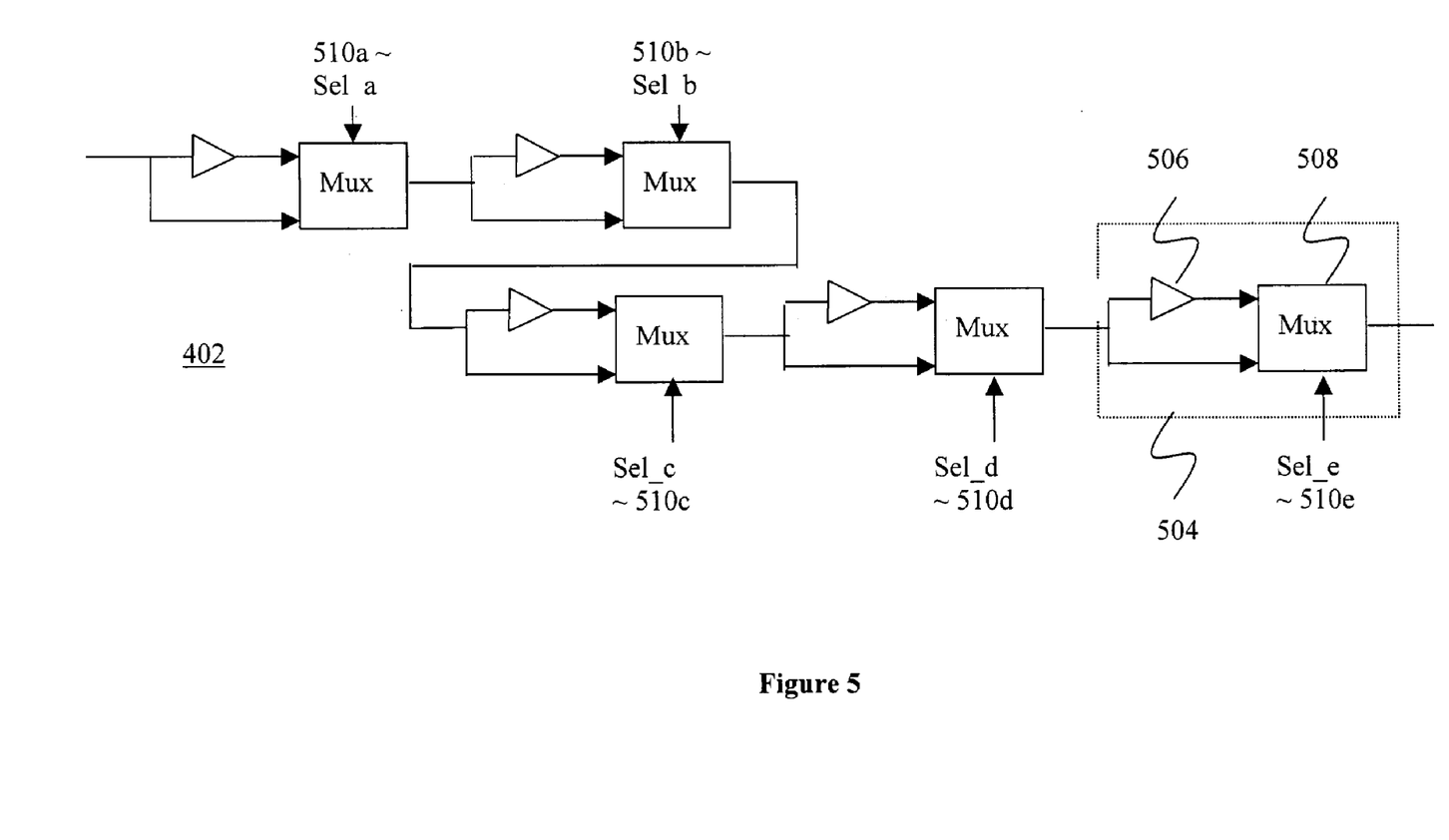
FIG. 5 illustrates the delay circuit of FIG. 4 in further detail, in accordance with one embodiment.

FIG. 5 illustrates delay circuit 402 in further detail, in accordance with one embodiment. As illustrated, delay circuit 402 includes a number of delay element and multiplexor pairs 504. More specifically, for the illustrated embodiment, delay circuit 402 includes five delay element and multiplexor pairs 504. In alternate embodiments, delay circuit 402 may include more or less delay element and multiplexor pairs 504.

For the embodiment, each delay element and multiplexor pair 504 includes delay element 506 and a multiplexor 508. The input of each delay element 506 is coupled to the output of the immediately preceding delay element and multiplexor pair 504, except for the first delay element and multiplexor pair 504, which delay element 506 is coupled to the data signal being received. Each delay element 504 applies a quantity of time delay to the input, and outputting the received input delayed by the quantity of time delay.

Multiplexor 508 receives either the output of the immediately preceding delay element and multiplexor pair 504 or the data signal being received directly, if pair 504 is the first pair, and output of its partner delay element 506. Multiplexor 508 outputs either the undelayed or delayed input, depending on whether it is to contribute to the application of the aggregate amount of time delay.

In one embodiment, the quantity of time delays to be applied by the various delay elements 506 of the various delay element and multiplexor pairs 504 are different. More specifically, in one implementation of the five pair embodiment, the time delays are 1000 ps, 500 ps, 250 ps, 125 ps and 62.5 ps respectively (ps=pico seconds).

Thus, when employed in combination, delay circuit 402 with the above described five time delay values may be selectively employed to apply 1 of 32 discontinuous aggregate amount of time delays to a data signal, i.e.

0 ps, 62.5 ps, 125 ps, 187.5 ps, 250 ps, 312.5 ps, 375 ps, 437.5 ps, 500 ps, 562.5 ps, 625 ps, 687.5 ps, 750 ps. 812.5 ps, 875 ps, 937.5 ps, 1000 ps, 1062.5 ps, 1125 ps, 1187.5 ps, 1250 ps, 1312.5 ps, 1375 ps, 1437.5 ps, 1500 ps, 1562.5 ps, 1625 ps, 1687.5 ps, 1750 ps, 1812.5 ps. 1875 ps, and 1937.5 ps, depending on the combination of the delay element and multiplexor pairs 504 employed.

In alternate embodiments, the delay elements of two or more of the delay element and multiplexor pairs may apply the same quantity of time delays.

Delay circuit 402 may also be used in an embodiment where the delay is applied to a derived version of the clock signal to achieve the effective delay of the data signal relative to the clock signal.

Detection Circuit

Figure 6:
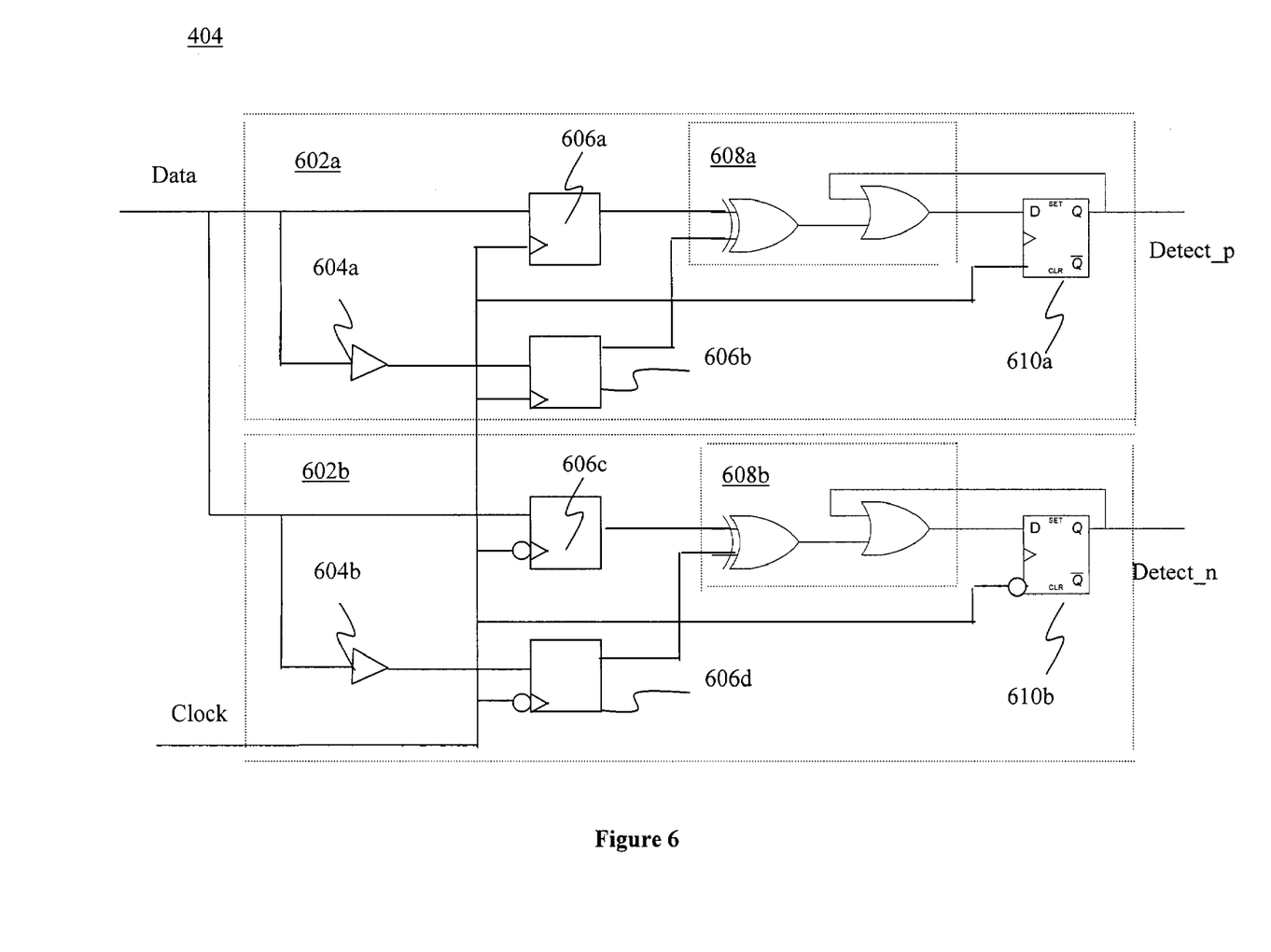
FIG. 6 illustrates the detection circuit of FIG. 4 in further detail, in accordance with one embodiment.

FIG. 6 illustrates detection circuit 404 in further detail, in accordance with one embodiment. For the embodiment, detection circuit 404 is equipped with two substantially similar sets of circuit elements, allowing it to concurrently detect faulty or risky data transition conditions with respect to either edge of a clock signal, i.e. the rising edge or the falling edge. More specifically, the two similar sets of circuit elements are equipped to detect whether the critical reference timing distance between either edge of a clock signal, i.e. the rising edge or the falling edge, has become sufficiently small to be considered faulty or "at risk". In alternate embodiments, the present invention may be practiced with detection circuit 404 being able to analyze the critical reference timing distance for a selected one of the clock edges only.

For the embodiment, each section 602a/602b comprises a number of storage elements 602a–602b/602c–602d, and 610a/610b, delay elements 604a/604b and a number of logic operators 608a–608b, coupled to each other as shown. More specifically, for the embodiment, each set of logic operators 608a–608b comprises a XOR gate and an OR gate coupled to each other and the other storage elements 602a–602b/602c–602d, and 610a/610b as shown.

Accordingly, the data signal, and a delayed version of the data signal are captured in storage elements 602a–602b/602c–602d, and subsequently outputted, as controlled by the clock signal or its inverse. The outputs are compared using the logic operators 608a/608b, and the result of the comparison is captured in storage element 610a/610b and outputted as the detection signal, denoting whether the critical reference time distance between the reference point of the data signal and the corresponding one of the clock edge has become smaller than the design/desired threshold, that it is considered to be "at risk" of having data transmission error.

The quantity of time delays to be applied by delay element 604a/604b is dependent at least on the clock speed, and the reference point of the data signal. In an embodiment where data are transmitted in accordance with OIF-SPI4-02.0, the quantity of time delays applied by delay element 604a/604b is 250 ps.

Control Circuit

Figure 7A:
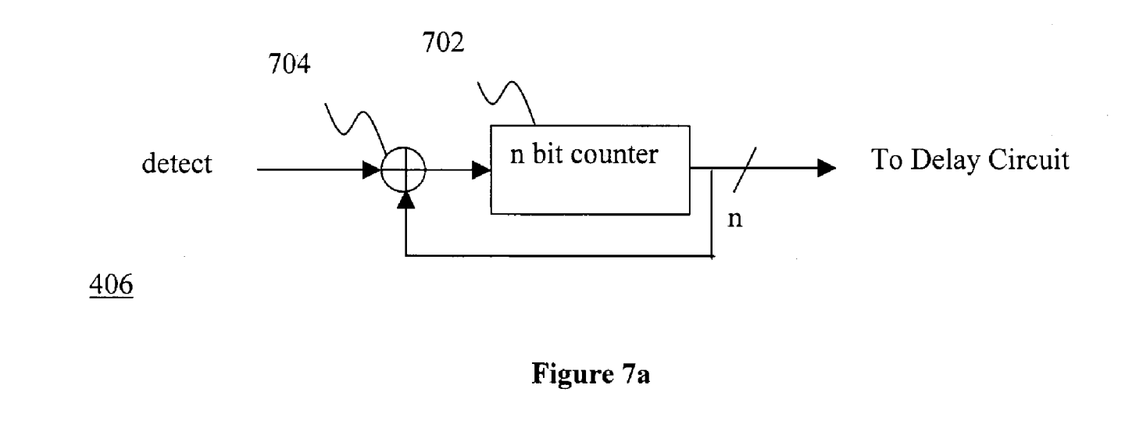
FIGS. 7a–7b illustrate the control circuit of FIG. 4 in further detail, in accordance with two embodiments.
Figure 7B:
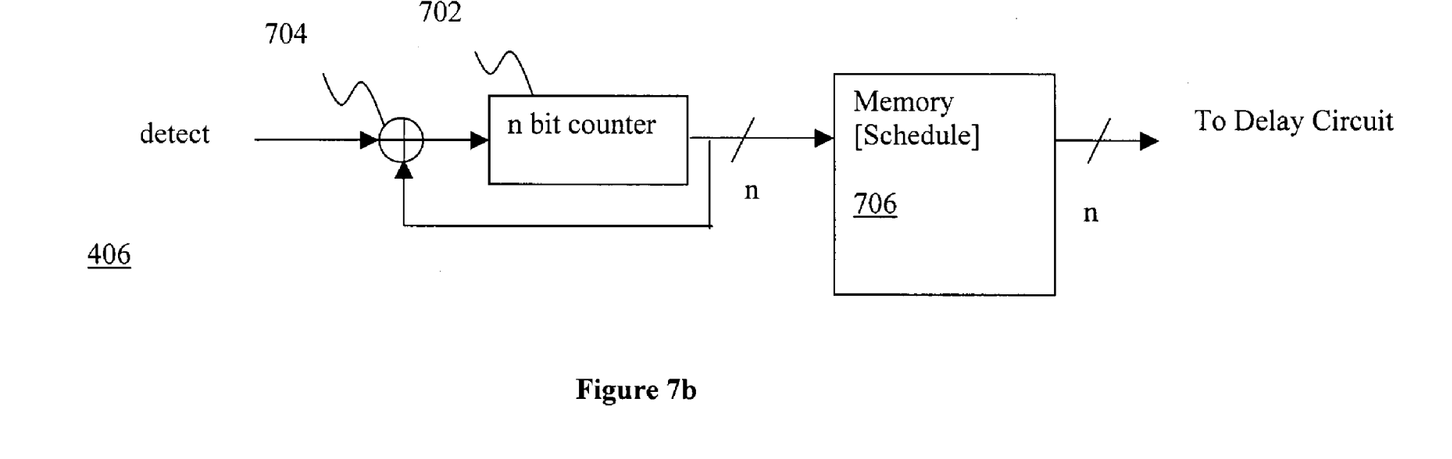

FIGS. 7a–7b illustrate control circuit 406 in further detail, in accordance with two embodiments. For the embodiment of FIG. 7a, control circuit 406 comprises n-bit counter 702 and an adder 704, coupled to each other, detection and delay circuits 402 and 404, as shown. N-bit counter 702 is employed to output n bits to correspondingly control the selection/employment of the n delay element and multiplexor pairs of delay circuit 402. The counter value is incremented by one, using adder 404, whenever the detection signal denotes the critical reference time distance of interest has become too small, and the data signal is to be considered faulty or "at risk" of having data transmission error.

In other words, for the embodiment, control circuit 406 increments the aggregate amount of time delay applied by delay circuit 402 in a deterministic manner. More specifically, control circuit 406 increments the aggregate amount of time delay applied by delay circuit 402 to the next discrete aggregate amount of time delay, delay circuit 402 is equipped to apply.

FIG. 7b illustrates an alternate embodiment. For the embodiment, in addition to the earlier described elements, control circuit 406 further includes memory 706 coupled to the earlier described elements as shown. Memory 706 is employed to store a time delay application schedule. The application schedule is typically designed to facilitate rapid convergence on the appropriate remedy, as described earlier. Output of n-bit counter 702 is employed to access and output the next scheduled time delay control instead. Thus, delay circuit 402 may be controlled in virtually any deterministic manner.

For example, in one embodiment, the delay circuit 402 may be initialized to apply the $15^{th}$ discrete aggregate amount of time delay, on detection, switch to the $16^{th}$ discrete aggregate amount of time delay, then the $14^{th}$, the 17th, the 13th, the 18th, and so forth, in other words, in an oscillating increasingly larger and smaller time delay manner.

Of course, this is just one of many deterministic variance of the application of the aggregate amount of time delay to regain a larger margin for the critical reference time difference, to reduce the likelihood of data transmission error occurrence.

In yet other embodiments, the control may be substantially performed via software. For example, an interrupt may be generated in response to the output of the signal detecting an error or "at risk" condition, and the software may analyze the current state of the critical reference time distance, the potential effects of various remedial options, select the option with a high or highest likelihood of achieving the desired correction, and then control the delay circuit accordingly.

CONCLUSION AND EPILOGUE

Thus, it can be seen from the above descriptions, an automatic data sampling timing adjustment circuit and its application to reduce data transmission errors have been described. While the present invention has been described in terms of the foregoing embodiments, those skilled in the art will recognize that the invention is not limited to these embodiments. The present invention may be practiced with modification and alteration within the spirit and scope of the appended claims. Thus, the description is to be regarded as illustrative instead of restrictive on the present invention.

What is claimed is:

1. An apparatus comprising:
   a first delay circuit to effectively delay a first data signal relative to a clock signal by a first aggregate amount of time delay;
   a first detection circuit to receive the first data signal and the clock signal, and to determine whether an amount of time between a reference point of the first data signal and a selected edge of the clock signal is smaller than a desired threshold; and
   a first control circuit coupled to the first detection circuit and the first delay circuit to receive the determination of the first detection circuit, and to dynamically control the first aggregate amount of time delay applied by the first delay circuit, based at least in part on the received determination of the first detection circuit.

2. The apparatus of claim 1, wherein the first delay circuit comprises
   a first delay element to receive the first data signal, delay the first data signal by a first quantity of time delay, and output the first data signal after delaying the first data signal by the first quantity of time delay;
   a first multiplexor coupled to the first delay element to receive the first data signal and the first data signal delayed by the first quantity of time delay, and output a selected one of the first data signal and the first data signal delayed by the first quantity of time delay;
   a second delay element coupled to the first multiplexor to receive the output of the first multiplexor, delay the received output of the first multiplexor by a second quantity of time delay, and output the received output of the first multiplexor after delaying the received output of the first multiplexor by the second quantity of time delay; and
   a second multiplexor coupled to the first multiplexor and the second delay element to receive the output of the first multiplexor and the output of the first multiplexor delayed by the second quantity of time delay, and output a selected one of the output of the first multiplexor and the output of the first multiplexor delayed by the second quantity of time delay.

3. The apparatus of claim 1, wherein the first delay circuit comprises n delay element and multiplexor pairs, serially coupled to each other and to the first data signal, with each delay element and multiplexor pair to output a selected one of its input and its input delayed by a corresponding quantity of time delay, with the corresponding quantities of time delay being selectively employed to apply the first aggregate amount of time delay, n being a positive integer.

4. The apparatus of claim 3, wherein at least one of the n delay element and multiplexor pairs comprises a delay element to receive a selected one of the first data signal and the output of an immediately preceding delay element and multiplexor pair, delay the received input by a quantity of time delay, and output the received input delayed by the quantity of time delay, and a multiplexor coupled to the input and output of the delay element to output a selected one of the input and output of the delay element.

5. The apparatus of claim 3, wherein the n delay element and multiplexor pairs comprise a first delay element and multiplexor pair equipped to output its input undelayed or delayed by a first quantity of time delay and a second delay element and multiplexor pair equipped to output its input undelayed or delayed by a second quantity of time delay, where the first and second quantities of time delay are different.

6. The apparatus of claim 3, wherein the n delay element and multiplexor pairs comprise five delay element and multiplexor pairs, each equipped to output its input undelayed or delayed by a corresponding quantity of time delay, where the five corresponding quantities of time delay are 1000 ps, 500 ps, 250 ps, 125 ps and 62.5 ps respectively.

7. The apparatus of claim 1, wherein the first control circuit comprises a storage element to store n bits to control the selection of n corresponding delay element and multiplexor pairs of the first delay circuit to contribute to the application of the first aggregate amount of time delay.

8. The apparatus of claim 1, wherein the first detection circuit comprises
   a first storage element to receive the first data signal and the clock signal to store and output data values of the first data signal as controlled by a selected one of the clock signal and an inverted version of the clock signal;
   a first delay element to receive the first data signal, delay the first data signal by a first quantity of time delay, and output the received first data signal by the first quantity of time delay, the first quantity of time delay being dependent on the desired threshold;
   a second storage element coupled to the delay element to receive the clock signal and the first data signal delayed by the first quantity of the time delay to store and output data values of the first data signal as delayed, and controlled by the selected one of the clock signal and the inverted version of the clock signal; and
   a first plurality of logic elements coupled to the first and second storage elements to receive outputs of the first and second storage elements, and in response, output a first output signal based at least in part on outputs of the first and second storage elements to denote whether the time distance between the reference point of the first data signal and a first edge of the clock signal is smaller than the desired threshold.

9. The apparatus of claim 8, wherein the first detection circuit further comprises a third storage element to receive the first data signal and the clock signal to store and output data values of the first data signal as controlled by the unselected one of the clock signal and the inverted version of the clock signal;

a second delay element to receive the first data signal, delay the first data signal by a second quantity of time delay, and output the received first data signal by the second quantity of time delay, the second quantity of time delay being dependent on the desired threshold;

a fourth storage element coupled to the second delay element to receive the clock signal and the first data signal delayed by the second quantity of the time delay to store and output data values of the first data signal as delayed, and controlled by the unselected one of the clock signal and the inverted version of the clock signal;

a second plurality of logic elements coupled to the third and fourth storage elements to receive outputs of the third and fourth storage elements, and in response, output a second output signal based at least in part on output of the third and fourth storage elements to denote whether the time distance between the reference point of the first data signal and a second edge of the clock signal is smaller than the desired threshold.

10. The apparatus of claim 1, wherein the first control circuit comprises a storage element to store a plurality of bits to control selection of delay elements of the first delay circuit to contribute to the application of the first aggregate amount of time delay; and control logic coupled to the storage element and the detection circuit to dynamically set/reset the plurality of bits based at least in part on the received determination of the first detection circuit.

11. The apparatus of claim 10, wherein the control logic modifies the plurality of bits in a deterministic manner whenever the received determination of the first detection circuit denotes the reference point of the first data signal and the selected edge of the clock signal is smaller than the desired threshold.

12. The apparatus of claim 11, wherein the control logic increments the plurality of bits by a pre-determined amount whenever the received determination of the first detection circuit denotes the reference point of the first data signal and the selected edge of the clock signal is smaller than the desired threshold.

13. The apparatus of claim 1, wherein the apparatus further comprises a second delay circuit to effectively delay a second data signal relative to the clock signal by a second aggregate amount of time delay;

a second detection circuit to receive the second data signal and the clock signal, and to determine whether an amount of time between a reference point of the second data signal and a selected edge of the clock signal is smaller than a desired threshold; and a second control circuit coupled to the second detection circuit and the second delay circuit to receive the determination of the second detection circuit, and to dynamically control the second aggregate amount of time delay to be applied by the second delay circuit, based at least in part on the received determination of the second detection circuit.

14. The apparatus of claim 13, wherein the apparatus further comprises a first pin coupled to the first detection circuit to provide the first detection circuit with the first data signal; and a second pin coupled to the second detection circuit to provide the second detection circuit with the second data signal.

15. The apparatus of claim 14, wherein the apparatus further comprises an integrated circuit comprising said first and second pins, said first and second delay circuits, said first and second detection circuits, and said first and second control circuits.

16. An apparatus comprising:

a first delay circuit to receive a first data signal, delay the received first data signal by a first aggregate amount of time delay, and output the received first data signal delayed by the first aggregate amount of time delay; the first delay circuit having n delay element and multiplexor pairs, serially coupled to each other and to the first data signal, with each delay element and multiplexor pair to output a selected one of its input and its input delayed by a corresponding quantity of time delay, with the corresponding quantities of time delay being selectively employed to apply the first aggregate amount of time delay, n being a positive integer; and a first control circuit coupled to the first delay circuit to dynamically control the first aggregate amount of time delay applied to the first data signal by the first delay circuit, based at least in part on a received detection signal denoting a time distance between a reference point of the first data signal and a selected edge of a clock signal is smaller than a desired threshold.

17. The apparatus of claim 16, wherein at least one of the n delay element and multiplexor pairs comprises a delay element to receive a selected one of the first data signal and the output of an immediately preceding delay element and multiplexor pair, delay the received input by a quantity of time delay, and output the received input delayed by the quantity of time delay, and a multiplexor coupled to the input and output of the delay element to output a selected one of the input and output of the delay element.

18. The apparatus of claim 16, wherein the first control circuit comprises a storage element to store n bits to control the selection of the n corresponding delay element and multiplexor pairs to contribute to the application of the first aggregate amount of time delay.

19. The apparatus of claim 18, wherein the control logic modifies the plurality of bits in a deterministic manner whenever the received detection signal denotes the reference point of the first data signal and the selected edge of the clock signal is smaller than the desired threshold.

20. The apparatus of claim 19, wherein the control logic increments the plurality of bits by a pre-determined amount whenever the received detection signal denotes the reference point of the first data signal and the selected edge of the clock signal is smaller than the desired threshold.

21. An apparatus comprising:

a first storage element to receive a first data signal and a clock signal to store and output data values of the first data signal as controlled by a selected one of the clock signal and an inverted version of the clock signal;

a first delay element to receive the first data signal, effectively delay the first data signal relative to the clock signal by a first quantity of time delay, and output the received first data signal effectively delayed by the first quantity of time delay, the first quantity of time delay being dependent on the desired threshold;

a second storage element coupled to the delay element to receive the clock signal and the first data signal effectively delayed by the first quantity of the time delay to store and output data values of the first data signal as effectively delayed, and controlled by the selected one of the clock signal and the inverted version of the clock signal; and a first plurality of logic elements coupled to the first and second storage elements to receive outputs of the first and second storage elements, and in response, output a first output signal based at least in part on outputs of the first and second storage elements to denote whether a time distance between a reference point of the first data signal and a first edge of the clock signal is smaller than a desired threshold.

22. The apparatus of claim 21, wherein the apparatus further comprises a third storage element to receive the first data signal and the clock signal to store and output data values of the first data signal as controlled by the unselected one of the clock signal and the inverted version of the clock signal;

a second delay element to receive the first data signal, effectively delay the first data signal by a second quantity of time delay, and output the received first data signal effectively delayed by the second quantity of time delay, the second quantity of time delay being dependent on the desired threshold;

a fourth storage element coupled to the second delay element to receive the clock signal and the first data signal delayed by the second quantity of the time delay to store and output data values of the first data signal as delayed, and controlled by the unselected one of the clock signal and the inverted version of the clock signal;

a second plurality of logic elements coupled to the third and fourth storage elements to receive outputs of the third and fourth storage elements, and in response, output a second output signal based at least in part on output of the third and fourth storage elements to denote whether the time distance between the reference point of the first data signal and a second edge of the clock signal is smaller than the desired threshold.

23. The apparatus of claim 22, wherein the apparatus comprises a detection circuit comprising said first, second, third and fourth storage elements, said first and second delay elements, and said first and second plurality of logic elements.

24. The apparatus of claim 23, wherein the apparatus comprises an integrated circuit comprising said detection circuit.

25. The apparatus of claim 21, wherein the apparatus comprises an integrated circuit having a detection circuit comprising said first and second storage elements, said first delay element, and said first plurality of logic elements.

* * * * *

UNITED STATES PATENT AND TRADEMARK OFFICE
CERTIFICATE OF CORRECTION

PATENT NO. : 7,100,067 B2
APPLICATION NO. : 10/393088
DATED : August 29, 2006
INVENTOR(S) : Victor Hansen et al.

Page 1 of 1

It is certified that error appears in the above-identified patent and that said Letters Patent is hereby corrected as shown below:

Column 6, line 5, "602a-602b/602c-602d" should read --606a-606b/606c-606d--.
Column 6, lines 10-11, "602a-602b/602c-602d" should read --606a-606b/606c-606d--.
Column 6, lines 13-14, "602a-602b/602c-602d" should read --606a-606b/606c-606d--.
Column 6, line 41, "using adder 404" should read --using adder 704--.

Signed and Sealed this

Tenth Day of November, 2009

David J. Kappos
*Director of the United States Patent and Trademark Office*